United States Patent [19]

Thomas

[11] 3,799,179

[45] Mar. 26, 1974

[54] PROCESSING APPARATUS WITH PRECISELY CONTROLLED AGITATION

[76] Inventor: Gertrude L. Thomas, 14 Fuller St., Magnolia, Mass. 01930

[22] Filed: Mar. 20, 1972

[21] Appl. No.: 236,380

[52] U.S. Cl. .................... 134/95, 134/102, 134/113, 156/345

[51] Int. Cl. .................... B08b 3/10

[58] Field of Search ............... 134/94, 95, 102, 113; 156/345

[56] References Cited

UNITED STATES PATENTS

| | | | |
|---|---|---|---|
| 3,227,166 | 1/1966 | Martz | 134/94 |
| 1,914,309 | 6/1933 | Tanner | 134/94 |
| 1,016,487 | 2/1912 | Freer | 134/94 |
| 3,598,651 | 8/1971 | Valavaara | 134/95 X |

OTHER PUBLICATIONS

Mathisen, "Etch Control Probe"; IBM Technical Disclosure Bulletin; Vol. 10, No. 3, August 1967, pp. 193–194.

*Primary Examiner*—Robert L. Bleutge
*Attorney, Agent, or Firm*—William C. Roch

[57] ABSTRACT

Apparatus for processing semiconductor wafers while providing precise control over the rate of agitation of processing solution in contact with the wafers. The invention has utility in several processing operations on semiconductor wafers such as developing, photolithographic etching and bubble cleaning. The apparatus includes a tank for holding a quantity of processing solution. A sparger, placed in the tank, has a plurality of apertures for releasing a precisely controlled amount of an inert gas such as nitrogen into the processing solution. A carrier loaded with a plurality of semiconductor wafers is placed on top of the sparger. During processing a precisely controlled amount of gas is released through the apertures in the sparger and bubbles up through the processing solution in intimate contact with the semiconductor wafers. This bubbling action provides precisely controlled agitation of the processing solution in intimate contact with the wafers.

8 Claims, 3 Drawing Figures

PROCESSING APPARATUS WITH PRECISELY CONTROLLED AGITATION

BACKGROUND OF THE INVENTION

The present invention relates generally to equipment for processing semiconductor wafers, and more particularly pertains to a new and improved processor for semiconductor wafers wherein a very precise control is provided over the extent of agitation of processing solution in intimate contact with the wafers.

In many processing operations on semiconductor wafers, such as the development of photoresist wafers and photolithographic etching of patterns on wafers, it is extremely important that the agitation of processing solution in contact with the wafers be controlled. In the development of photoresist wafers, the agitation msut be controlled to continually bring fresh developing solution into contact with the wafers to assure even development over the entire surface of the wafers. Uneven development cannot be tolerated in many such situations. Also, during photolithographic etching of patterns on semiconductor wafers, the agitation of etching solution must be controlled to remove products of the etching reaction from the surface being etched. Otherwise, the etching reaction will decrease in varying rates across the area of the etched surface, which will cause nonuniform etching and result in many poor and unuseable patterns.

In the art of processing of semiconductor wafers, it has been a practice to utilize one of several alternative methods for agitating processing solution in intimate contact with the wafers. These prior art methods of agitating have been unsatisfactory in that they have not provided a means for processing large batches of semiconductors wafers while providing precise control over the agitation of processing solution in contact with the wafers.

One known method of developing photoresist semiconductor components is to spray the wafers with a low pressure, fine spray for a short period of time, generally 30–90 seconds, followed immediately by a similar spray application of one or more rinse solutions. The spraying may be done manually with a hand held spray gun which provides a fine spray in the shape of a cone. This method has been of limited usefulness as no more than two or three wafers can be uniformly developed at one time. It is difficult for the operator to move the spray gun over the wafers such that all areas of all the wafers are evenly contacted with the sprayed solution.

The above-mentioned manual spraying operation has been largely replaced by an automatic spray developer. In this automatic developer a small number of wafers, usually six to eight, are placed in horizontal positions around a ring. The ring is then fitted over a rotating shaft which is located inside a cylindrical vessel. The cover of the vessel contains a number of solenoid operated spray nozzles. Some of the spray nozzles are supplied with developing solution, and others of the spray nozzles are supplied with rinse solution. In this automatic developer, controls are provided for regulating the developing time, the rinsing time, the nozzle pressure and the flow of solutions through the nozzles. When the cover is closed the ring rotates under the spray nozzles such that, in theory, all wafers are sprayed equally by each nozzle. At the end of the processing operation the cover is opened and the wafers are removed. New wafers are then loaded on the ring and the above-described operation is repeated.

The two methods described above of spraying developing solution onto semiconductor wafers are used in most production operations today. However, spray processing has several disadvantages. The shape and drop size of the spray significantly affect the edge definition of patterns and the uniformity of development of the semiconductor wafers. Mechanical alignment, spray pressure, and the viscosity of the processing solution must all be precisely controlled to achieve good results. Equipment to provide this precise control is commercially available, but is very expensive. Also, with the spray processing described above, each wafer must be unloaded from a standard wafer carrier utilized in the industry, positioned for development, and then reloaded into the carrier after development. Where processing of both sides of the semiconductor wafer is required, two separate spraying operations must be carried out to develop both sides of the wafer. Further, with the equipment that is commercially available, it is very difficult to use different types of photoresist developers in the same equipment. This generally limits the production operation to utilization of only one type of photoresist material, although in some parts of the production process it would be advantageous to use different types of photoresist materials.

Another known method of developing photoresist wafers is batch developing. With batch developing separate containers of developer and rinse solutions are required. The semiconductor wafers are loaded vertically in a wafer carrier which is a standard wafer carrier used in other steps of the production process. The wafer carrier is generally used to handle semiconductor wafers in the production step just prior to the step of developing and further in the production step just subsequent to developing. A typical wafer carrier has slots for 30 to 40 wafers, and has a handle extending from the center of the carrier. The operator grasps the handle of the carrier and immerses the carrier into the developer tank for a short time, typically 30 to 90 seconds. During this time the operator agitates the solution by slowly moving the wafer carrier up and down in short strokes. Following the processing step the carrier is transferred to the rinse tank, and the agitation process is repeated.

The above-described process of batch developing is not generally utilized throughout the industry as it has certain disadvantages. One drawback is that the process is completely dependent upon the skill of the operator. Another disadvantage is that residual photoresist material may be left in developed areas, or excessive developing may occur if proper agitation is not employed.

Another area wherein the present invention finds utility is in the area of photolithographic etching wherein patterns are etched onto the surfaces of semiconductor wafers. Photolithographic etching is commonly carried out on wafer surfaces formed of materials such as semiconductor material, insulator material or metal. Photolithographic etching is a key step in the fabrication of many electronic products such as printed circuits, transistors, integrated circuits, hybrid circuits, etc. In the photolithographic etching process it is extremely important to remove the products of the etch reaction from the vicinity of the etched surfaces or the rate of etching will decrease. In this process, if no means are provided to remove the products of the etch reaction, natural diffusion will remove some products, but the extent of removal will vary across the area of the surface. This uncontrolled variation will cause non-uniform etching, and will result in many poor and unusable patterns. Many methods have been utilized in an attempt to provide forced convection of the etching solution so as to control the uniformity of the rate of removal of etch products, and therefore the rate of etching. One known method is manual agitation of the etched wafers, but as in the spray developing process described above manual agitation depends to a very large extent upon the skill of the operator. Spray etching has also been utilized, and it is generally effective for large etched patterns. Unfortunately spray etching does not work well for fine patterns of several microns. Ultrasonic agitation of the etching solution has also been tried. Unfortunately ultrasonic agitation may easily disrupt the photoresist material and cause etching in undesired areas. Further, this process may not be utilized with heated etching solutions as the ultrasonic agitation generates localized heat sources. Another method which has been tried is stirring of the etching solution around a wafer carrier while the wafer carrier is immersed in the solution. This process is generally effective, but unfortunately the uniformity of the resultant etch is dependent upon the operator's skill as well as the number and position of products being etched and the geometry of the wafer carrier.

The prior art also utilized processors for the cleaning of silicon and metal semiconductor wafers. In the cleaning process chemicals such as ammonia hydroxide and hydrogen peroxide were mixed and then heated to start a rapid evolution of gas bubbles. A standard wafer carrier loaded with semiconductor wafers was then placed in the solution, and the scrubbing action of the evolved gas bubbles removed contamination from the wafers. Unfortunately the rate of generation of bubbles varied widely depending upon the freshness of the chemical used, the ambient temperature and many other parameters.

SUMMARY OF THE INVENTION

In accordance with a preferred embodiment, a processing apparatus is disclosed wherein the extent of agitation of processing solution in intimate contact with the components being processed is precisely controlled.

In the preferred embodiment illustrated in the drawings a container is utilized to hold a quantity of processing solution. A carrier holding a plurality of components is immersed in the processing solution to enable processing of the components. The processor has a plurality of apertures located below the components in the carrier tray when the tray is immersed in the processing solution. The plurality of apertures release a precisely controlled amount of gas into the processing solution below the components being processed to provide precisely controlled agitation of the processing solution in contact with the components.

Although the preferred embodiment was designed for the processing of semiconductor wafers, other embodiments might be designed for other applications wherein the agitation of processing solution in contact with components being processed must be precisely controlled. A processor built in accordance with the preferred embodiment might be utilized in the processes of developing of photoresist semiconductor wafers, photolithographic etching of semiconductor wafers, cleaning of semiconductor wafers, or in other processes wherein the rate of agitation of processing solution in intimate contact with the wafers being processed must be precisely controlled.

Batch developing of photoresist semiconductor wafers when carried out properly in accordance with the teachings of this invention provides superior edge definition of the developed pattern and a minimum of swelling of the photoresist materials. Also, when the teachings of this invention are applied to photolithographic etching of semiconductor products, removal of the etch products of the etch reaction from the vicinity of the etched surface is precisely controlled. This controlled removal results in uniform etching across the area of the etched surface, and provides etched patterns with superior definition.

A processor built according to the teachings of this invention provides the reliability and uniformity of spray processing without the need for a highly skilled operator and also without the requirement for complex and costly equipment. Further, the preferred embodiment provides a processor having the simplicity of a batch processor without any of the aforementioned disadvantages of a batch processor since agitation of the processing solution is precisely controlled. The processor of the preferred embodiment is considerably less complex than spray processors, and maintenance is comparable to that of prior art batch developing processors.

Further, the preferred embodiment provides a processor wherein handling of the processed components is kept to a minimum as the components remain in a standard component carrier. This is especially valuable in those processes wherein the step immediately preceeding the processing and the step immediately following the processing also utilize a standard carrier. Also, the preferred embodiment provides a processor wherein both sides of each of a plurality of components may be processed simultaneously while the agitation of processing solution in intimate contact with both sides of the components is precisely controlled. Still further, the preferred embodiment provides a processor wherein many different types of photoresist developers may be conventiently utilized as additional developers only require additional containers for the additional developer and rinse solutions. Also, the preferred embodiment provides a very simple and inexpensive processor which may be maintained with a minimum of maintenance and equipment down time.

DETAILED DESCRIPTION OF A PREFERRED EMBODIMENT

Figure 1:
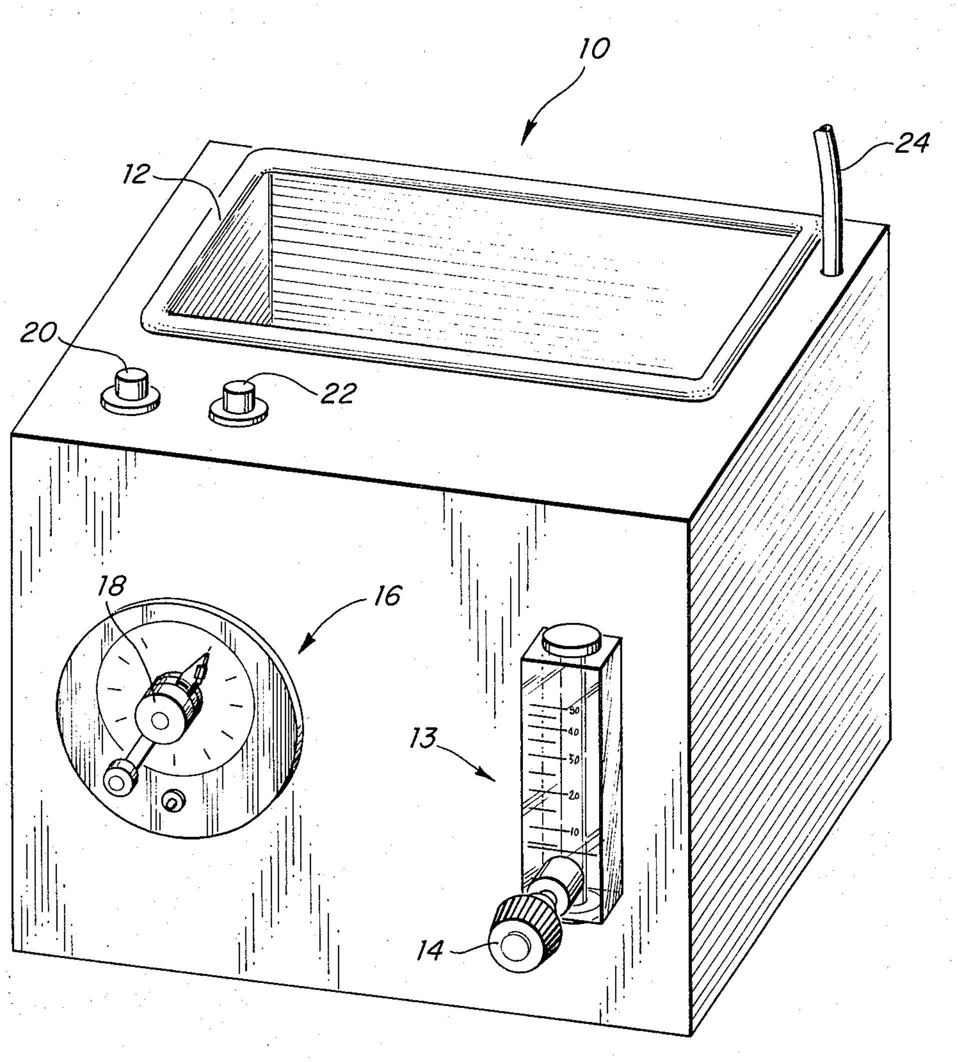
FIG. 1 illustrates a perspective view of a preferred embodiment of a processor constructed in accordance with the teachings of this invention.

FIG. 1 illustrates a perspective view of a preferred embodiment of a processor 10 constructed in accordance with the teachings of this invention. The processor 10 includes a removable tank 12 which in the preferred embodiment is constructed of stainless steel. During operation of the processor the tank 12 is filled with processing solution. The processor includes a flow meter 13 with an adjustment 14 to control the rate of flow of gas in the processor. The unit also has a timer 16 for timing processing operations. The timer includes an adjustment 18 for setting the timer to the desired processing time. A timer switch 20 and timer light 22 are also utilized, in a manner which will be explained later, to control the timing of the processing operation. A tube 24 extends from the top of the processor for connection with a sparger unit, illustrated in FIG. 2, which is normally placed on the bottom of tank 12.

Figure 2:
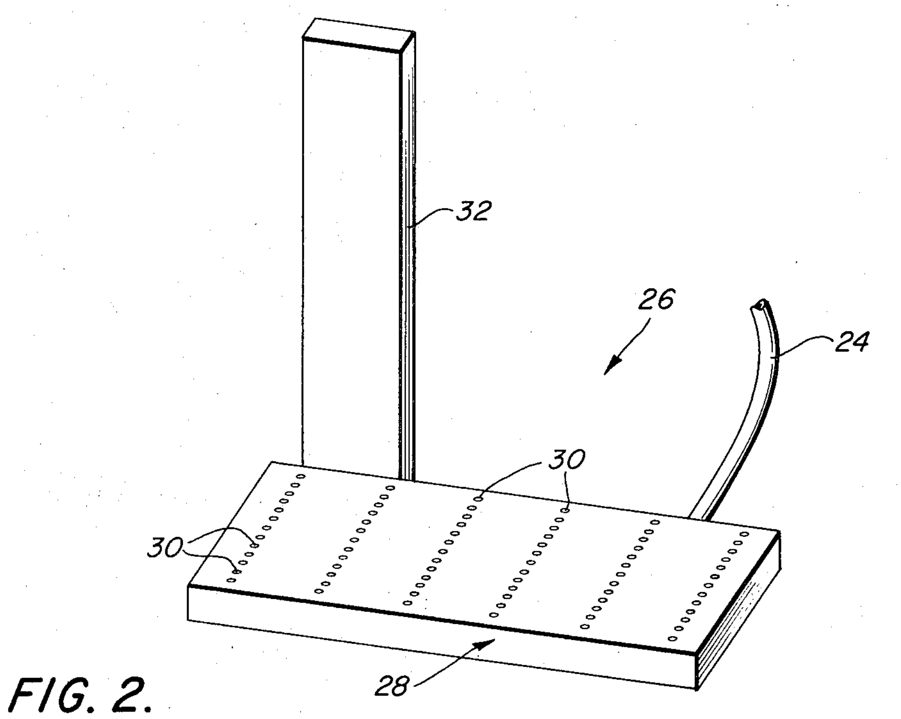
FIG. 2 illustrates a gas emitting sparger which is placed in the developing tank of the processor illustrated in FIG. 1.

FIG. 2 illustrates a sparger unit 26 which is connected to a supply of gas by a tube 24 which is attached at its other end to the processor unit 10, as illustrated in FIG. 1. The base 28 of the sprager includes a plurality of apertures 30 which are located in an array of rows and columns, the rows being illustrated in a horizontal position in FIG. 2. The base 28 also includes an internal manifold system for allowing gas to flow from the inlet gas supply tube 24 to each of the plurality of holes 30. The sparger has a handle 32 which is located in one corner of the tank 12 when the sparger is positioned in the tank. The handle 32 normally extends above the level of processing solution in the tank, and is used whenever it is desired to remove the sparger from the tank.

Figure 3:
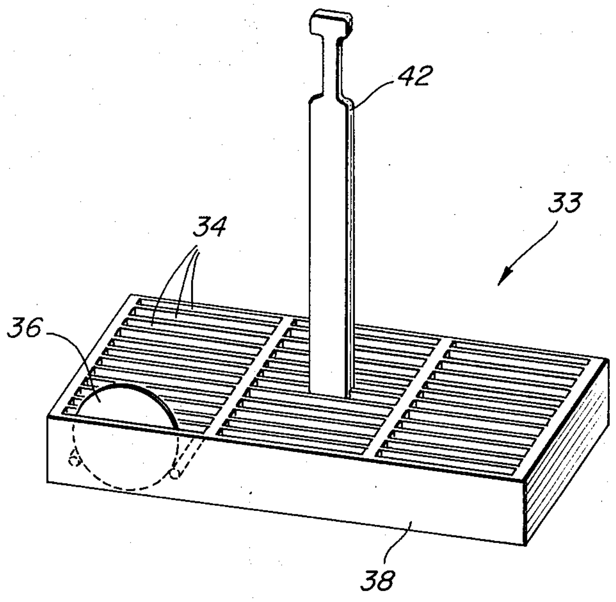
FIG. 3 shows a typical wafer carrier which may be utilized in the processor of FIG. 1.

FIG. 3 illustrates a typical wafer carrier 33 which may be utilized in the processor. The wafer carrier may be constructed of Teflon, and includes a plurality of slots 34 for holding a plurality of semiconductor wafers 36, only one of which is illustrated. The slots are constructed in an array of rows and columns, the rows being shown in a horizontal position in FIG. 3. The base 38 of the carrier 33 is constructed in a porous manner with many openings therein to allow processing solution and gas bubbles to flow freely through the carrier. The rows of slots in the wafer carrier are arranged relative to the rows of apertures in the sparger such that when the carrier is properly positioned upon the sparger, apertures in the sparger are located on both sides of each row of wafers in the carrier. This arrangement ensures that gas bubbles will provide controlled agitation of the processing solution on both sides of each semiconductor wafer. The carrier also includes a centrally positioned handle 42 which is used to place the carrier into and remove the carrier from the tank.

The operation of the processor will now be explained. The processor is normally connected to a supply of inert gas such as nitrogen through a coupling located at the rear of the processor. The supply of inert gas may be 40 psi dry filtered nitrogen. The processor also includes an electrical connection for supplying power to the timer controls. The tank is first filled with a sufficient quantity of processing solution. The sparger 26 is placed in the bottom of tank 12. The desired nitrogen flow rate is set by control 14 of flow meter 12. The desired processing time is set by adjustment 18 on clock 16. In many processing operations the wafers will already be loaded in the wafer carrier as the carrier is utilized in the industry in many different processing operations. The wafer carrier, loaded with semiconductor wafers, is then placed in tank 12. During this placement step the corner diagonally opposite from the sparger handle may be used as a guide to properly position the carrier relative to the sparger 26. In alternative embodiments other placement means might be utilized, and in some embodiments placement guides may not be required. Immediately thereafter the timer button 20 is pushed to actuate the timer 16 and also turn on processing light 22. After the timer 16 times the desired processing time, the timer turns light 22 off, which signifies to the operator that processing is completed. Other signaling means might be used in alternative embodiments. The operator then removes the wafer carrier from the tank 12. If the processor is being utilized in the development of photoresist semiconductor wafers, the tank of developing solution is removed and replaced with a tank of rinse solution. The carrier is then placed in the tank of rinse solution, and the same timing operation is repeated to ensure controlled rinsing of the wafers.

Although one particular timing set up has been illustrated, other timing arrangements could be substituted within the teachings of this invention. Further, although the gas emitting apertures 30 are illustrated as being in the sparger 26, alternative embodiments might place the apertures in other locations such as in the bottom of tank 12 or in the bottom of a specially constructed carrier. Also, embodiments of the invention might be constructed with alternative ways of controlling the flow of gas in the processor. While several embodiments have been described, the teachings of this invention will suggest many other embodiments to those skilled in the art.

I claim

1. Apparatus for precisely controlling the agitation of processing solution in intimate contact with semiconductor wafer components immersed in the processing solution and being treated by the processing solution, and thereby precisely controlling the rate of processing of the components, and comprising:

a. a container for holding a quantity of processing solution;

b. means for holding a plurality of components for immersion in processing solution located in said container and including a semiconductor wafer carrier means having a plurality of separate compartments located in an array of rows and columns, whereby individual components may be inserted into said individual compartments, and the tray with the components may be inserted into the processing solution in said container, whereby the components may be processed by the processing solution;

c. means for releasing a precisely controlled amount of gas into the processing solution and below the components and including a plurality of apertures located below the components when the components are immersed in processing solution in said container, and a timer means for indicating the length of time during which gas is bieng released into the processing solution, whereby the controlled amount of released gas may bubble up through the processing solution in intimate contact with the components and provide a precisely controlled agitation of the processing solution in intimate contact with the components.

2. Apparatus as set forth in claim 1 wherein said means for releasing a controlled amount of gas into the processing solution includes a flow meter for controlling the rate of release of gas into the processing solution.

3. Apparatus as set forth in claim 2 wherein said means for releasing a controlled amount of gas into the processing solution includes a sparger means which may be inserted into and placed on the bottom of said container, said sparger means having said plurality of apertures formed therein.

4. Apparatus as set forth in claim 3 wherein the apertures in said sparger means are located relative to the compartments in said tray means such that when the tray means is placed on top of the sparger means the apertures in said tray means will form rows on each side of said rows of compartments, whereby the rows of apertures on each side of a row of compartments will provide controlled agitation of processing solution on both sides of components located in said compartments.

5. Apparatus as set forth in claim 1 wherein said means for releasing a controlled amount of gas into the processing solution includes a sparger means which may be inserted into and placed on the bottom of said container, said sparger means having said plurality of apertures formed therein.

6. Apparatus as set forth in claim 5 wherein the apertures in said sparger means are located relative to the compartments in said tray means such that when the tray means is placed on top of the sparger means the apertures in said tray means will form rows on each side of said rows of compartments, whereby the rows of apertures on each side of a row of compartments will provide controlled agitation of processing solution on both sides of compartments located in said compartments.

7. Apparatus for precisely controlling the agitation of processing solution in intimate contact with semiconductor components immersed in the processing solution and being treated by the processing solution, and thereby precisely controlling the rate of processing of the components, and comprising:

a. a container for holding a quantity of processing solution;

b. means for holding a plurality of components for immersion in processing solution located in said container and including a semiconductor component carrier means having a plurality of separate compartments located in an array of rows and columns, whereby individual components may be inserted into said individual compartments, and the tray with the components may be inserted into the processing solution in said container, whereby the components may be processed by the processing solution;

c. means for releasing a precisely controlled amount of gas into the processing solution and below the components and including a plurality of apertures located below the components when the components are immersed in processing solution in said container, and a flow meter means for precisely controlling the flow of gas released into the processing solution, whereby the controlled amount of released gas may bubble up through the processing solution in intimate contact with the components and provide a precisely controlled agitation of the processing solution in intimate contact with the components.

8. Apparatus as set forth in claim 7 wherein said means for releasing a precisely controlled amount of gas into the processing solution includes a sparger means which may be inserted into and placed on the bottom of said container, said sparger means having said plurality of apertures formed therein.

* * * * *